United States Patent [19]

Ng Chiong et al.

[11] Patent Number: 5,178,975
[45] Date of Patent: Jan. 12, 1993

[54] HIGH RESOLUTION X-RAY MASK HAVING HIGH ASPECT RATIO ABSORBER PATTERNS

[75] Inventors: Kaolin Ng Chiong, Pleasantville; David E. Seeger, Congers, both of N.Y.

[73] Assignee: International Business Machines Corporation, Armonk, N.Y.

[21] Appl. No.: 645,846

[22] Filed: Jan. 25, 1991

[51] Int. Cl.$^5$ .......................... G03F 9/00; B05B 5/00
[52] U.S. Cl. ........................................ 430/5; 430/14; 430/15; 430/323; 427/44; 427/160
[58] Field of Search .................. 430/5, 14, 15, 323; 427/44, 160

[56] References Cited

U.S. PATENT DOCUMENTS

| | | | |
|---|---|---|---|
| 4,018,938 | 4/1977 | Feder et al. | 430/5 |
| 4,035,522 | 7/1977 | Hatzakis | 427/43 |
| 4,328,298 | 5/1982 | Nester | 430/5 |
| 4,329,410 | 5/1982 | Buckley | 430/5 |
| 4,702,995 | 10/1987 | Okada | 430/311 |
| 4,873,162 | 10/1989 | Yoshioka et al. | 430/5 |

Primary Examiner—Marion E. McCamish
Assistant Examiner—Mark A. Chapman
Attorney, Agent, or Firm—John J. Goodwin

[57] ABSTRACT

A technique for making a high resolution X-ray mask with high aspect ratio absorber patterns sufficient for use in X-ray lithography wherein a thin resist layer is used to provide a low contrast mask, and then an X-ray exposure is used to increase the aspect ratio of the absorber to increase the contrast of the mask. The mask is first patterned with an e-beam resist exposure and development step, and the plating of the base material is activated by a reactive ion etch followed by electroplating. The resist is removed and the mask is coated with a negative acting X-ray resist. The back of the mask is exposed to X-rays wherein the existing absorber acts as an X-ray mask to expose the desired areas of the resist. The resist is removed after development, reactive ion etching and electroplating resulting in a mask with high contrast.

6 Claims, 1 Drawing Sheet

HIGH RESOLUTION X-RAY MASK HAVING HIGH ASPECT RATIO ABSORBER PATTERNS

BACKGROUND OF THE INVENTION

1. Field of the Invention

The present invention relates to masks used in X-ray lithography, and more particularly to a technique for making a high resolution X-ray mask with high aspect ratio absorber patterns.

2. Description of the Prior Art

U.S. Pat. No. 4,035,522 issued Jul. 12, 1977 to Hatzakis and entitled X-RAY LITHOGRAPHY MASK describes an X-ray mask for variable resist exposure for use with X-ray lithography so that multilevel devices, using a single exposure of X-rays, can be made.

U.S. Pat. No. 4,328,298 issued May 4, 1982 to Nester entitled PROCESS FOR MANUFACTURING LITHOGRAPHY MASKS discloses a method for manufacturing X-ray lithography masks containing features smaller than 1 micron in size and having conductive or nonconductive substrates. The method involves the initial deposition, as by evaporation, of a very thin coating of a strong X-ray absorber such as gold. A layer of photoresist is applied to the initial gold layer and exposed and developed to remove the photoresist in the exposed areas. Thereafter, the mask is submerged in an electroless gold plating bath. Metals suitable for electroless plating are autocatalytic in nature. Thereafter, additional gold from the bath is preferentially deposited on the exposed first gold layer and is permitted to build to the desired thickness.

U.S. Pat. No. 4,329,410 issued May 11, 1982 to Buckley entitled PRODUCTION OF X-RAY LITHOGRAPHIC MASKS describes a method of depositing X-ray absorber patterns on a mask membrane to achieve minimum pattern feature dimensions less than 1 $\mu m$. The membrane is covered with an ultraviolet (UV) sensitive photoresist which carries a thin metallic film. The metallic film is coated with an electron beam resist. The electron beam resist is exposed to the desired pattern by an electron beam. After development, the metal film is etched through the remaining electron beam resist. This forms a stencil overlying the lower UV photoresist layer which is then exposed by an ultraviolet or soft X-ray source. After development, an X-ray absorber, such as gold, is deposited on the membrane. The final exposure step may be done by means of a point source of radiation. The X-ray absorbers will then have sloping walls to prevent shadowing of the X-ray source.

U.S. Pat. No. 4,702,995 issued Oct. 27, 1987 to Okada entitled METHOD OF X-RAY LITHOGRAPHY teaches a method of lithography employing an electromagnetic wave having a very short wave length such as X-ray and a resist layer sensitive to that electromagnetic wave is disclosed. The irradiation process is divided into two steps. One step is selectively irradiating the electromagnetic wave to the resist layer in a desired pattern. The other step is nonselective irradiation over the entire area of the resist layer. The latter step may be conducted with a plurality of workpieces such as semiconductor wafers simultaneously.

U.S. Pat. No. 4,873,162 issued Oct. 10, 1989 to Yoshiska et al entitled X-RAY MASK AND A MANUFACTURE METHOD THEREFOR describes an X-ray mask for X-ray lithography that has an X-ray absorber pattern which is formed from a Ti-W alloy, with a Ti content of 0.5–10 weight %. A method for the manufacture of the X-ray mask comprises sequentially forming a first film, a Ti-W alloy film with a Ti content of approximately 0.5–10 weight %, and a third film on a mask substrate and coating the third film with an electron beam-sensitive resist, exposing the resist to an electron beam and then developing the exposed resist to form a resist pattern, using the resist pattern as a mask and selectively etching the third film to form a pattern, and using the pattern as a mask and selectively etching the Ti-W alloy film with a reactive gas to form an absorber pattern. The Ti-W alloy film is preferably formed by sputtering in an atmosphere of argon and nitrogen gas with a nitrogen content of approximately 30–50%, whereby nitrogen is included in the Ti-W alloy film.

BRIEF SUMMARY OF THE INVENTION

An object of the present invention is to provide a technique for making a high resolution X-ray mask with high aspect ratio absorber patterns sufficient for use in X-ray lithography.

A further object of the present invention is to provide a technique for fabricating an X-ray mask wherein a thin resist layer is used to provide a low contrast mask, and then an X-ray exposure is used to increase the aspect ratio of the absorber to increase the contrast of the mask.

Still another object of the present invention is to provide a technique for X-ray mask fabrication wherein the mask is first patterned with an e-beam resist exposure and development step, and the plating of the base material is activated by a reactive ion etch followed by electroplating. The resist is removed and the mask is coated with a negative acting X-ray resist. The back of the mask is exposed to X-rays wherein the existing absorber acts as an X-ray mask to expose the desired areas of the resist. The resist is removed after development, reactive ion etching and electroplating resulting in a mask with high contrast.

DESCRIPTION OF THE PREFERRED EMBODIMENTS

X-ray lithography is employed to accurately produce patterns on wafers with features too small to be formed by optical techniques. The features are formed using an X-ray mask which includes a membrane which is essentially transparent to X-rays, and a pattern on the membrane composed of X-ray absorbing material. The thickness of the absorbing material must be sufficient to produce a high contrast, which is the ratio of the X-ray transmission through the membrane only to the transmission through the X-ray absorber on the membrane. In current practice, the typical contrast is 10 to 1 to 12 to 1.

Since the advent of X-ray lithography, the material used for absorber patterns of X-ray masks has primarily been gold. Gold has a high absorption coefficient with respect to the soft X-rays which are used in X-ray lithography. Furthermore, as gold is soft compared to other metals, when a gold film is formed on a mask substrate, the stresses which are imparted to the substrate, which are the cause of distortions in the absorber pattern, are low.

One of the challenges of X-ray mask fabrication is fabricating a high resolution mask with high aspect ratio absorber patterns, where the aspect ratio is the ratio of the minimum feature width to the absorber height, to produce a mask with sufficient contrast for X-ray lithography. Using an additive electroplating-type process for absorber formation requires a resist stencil of even higher aspect ratio to account for local non-uniformities. This is difficult to do with standard electron beam patterning processes since scattering of electrons within the resist causes difficulties in achieving vertical profiles with high aspect ratio images. Multilayer (MLR) resist processes have been used for producing high aspect ratio resist stencils while preserving the advantages of patterning a thin layer of e-beam resist. This technique suffers from the inherent problems of process bias in the pattern transfer process (thereby limiting ultimate resolution) and from damage of the underlying plating base by the pattern transfer technique.

The present invention provides a process for increasing the absorber thickness of an existing mask by using X-ray exposure to increase the aspect ratio of the absorber. In this way, a thin resist layer can be used to produce a "low" contrast mask followed by further processing (described herein) to increase the contrast of the mask. The absorber height will be 6,000 to 8,000 Å for a minimum feature width of 0.1 microns. Since 6,000 Å equals 0.6 microns, the gain in the aspect ratio is from 6 to 1 to 8 to 1.

In the fabrication of the X-ray mask of the present invention, an electron beam exposure step is first employed, as is typical in the prior art, and then later an X-ray exposure step is used.

Figure 1A:
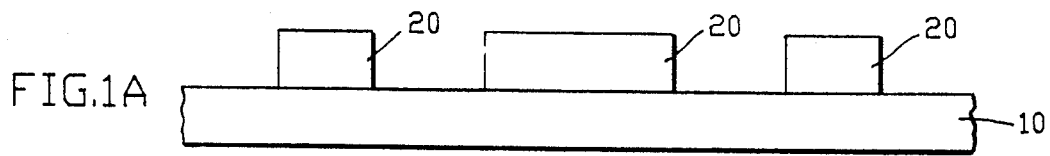
FIGS. 1A, 1B, 1C, 1D, 1E and 1F are schematic illustrations of the cross section of an X-ray mask structure of the present invention at separate stages in its fabrication.

Referring to FIG. 1A, a cross-sectional illustration of an X-ray mask membrane or substrate 10 is shown having a pattern of absorbing material 20 thereon. As previously stated, the X-ray absorbing material 20 is gold, and the mask membrane or substrate 10 is desired to be transparent to X-rays and is composed typically of a conventionally used inorganic compound such as BN, SiN or SiO2. Although it is not shown in the drawings, the membrane 10 is normally mounted in a support ring.

Initially, to form the structure shown in FIG. 1A, the membrane 10 is coated with a thin electron-beam resist layer approximately 3,000 Å thick. The resist layer is exposed by electron beam radiation and developed and reactively ion etched. The resulting surface is electroplated with gold and the resist removed to produce the structure illustrated in FIG. 1A.

Figure 1B:
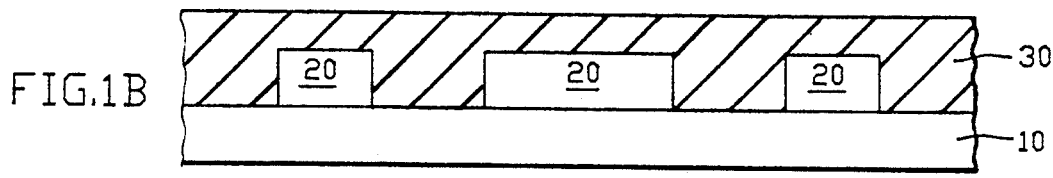

As previously stated, the height of the absorber material 20 is approximately 6,000 Å. A layer of negative acting X-ray resist 30, such as epoxy type cross-linking resist is coated over the membrane 10 and absorber material 20 (FIG. 1B).

Figure 1C:
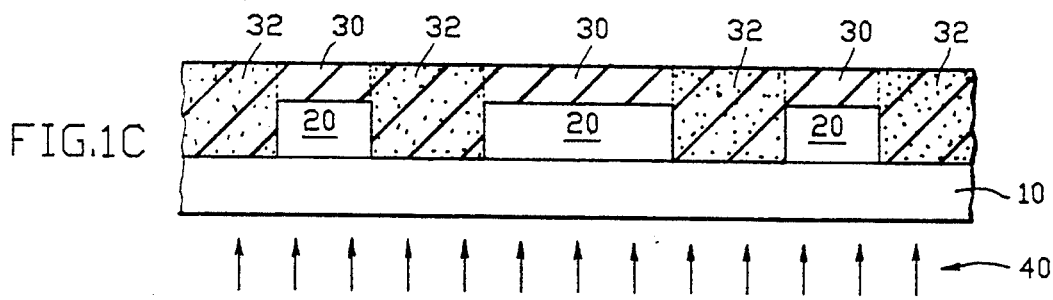
Figure 1D:
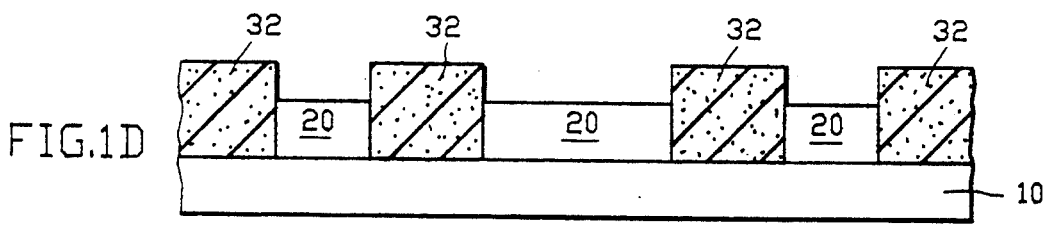

The structure is then exposed to X-rays 40 from the back of the membrane 10, a typical dosage being from 80 to 100 mj/cm². The absorber pattern 20 acts as a mask and the unmasked portions 32 of the resist become exposed as illustrated in FIG. 1C. The structure is developed and reactive ion etched to produce the structure shown in FIG. 1D.

Figure 1E:
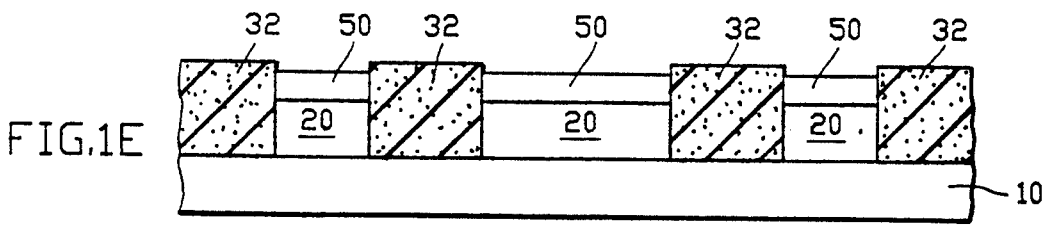

Another electroplating step is performed to increase the height of the gold absorber portions 20 by the amount 50 as shown in FIG. 1E. A typical height increase results in a final height of 8,000 Å.

Figure 1F:
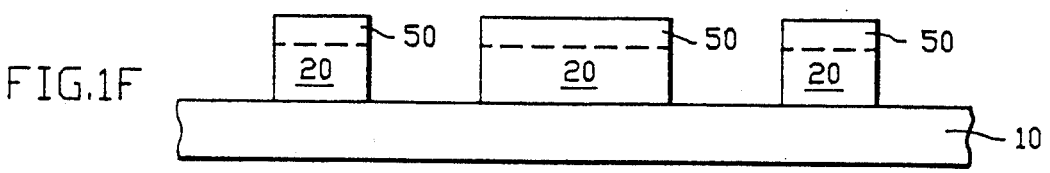

Finally, the resist portions 32 are removed to provide a mask with higher contrast as shown in FIG. 1F wherein a thin layer of resist with electron beam exposure is permitted for the patterning step, thereby easing the resist requirements and improving line width control. Thereafter, another layer of resist with X-ray exposure is used to increase the height of the absorber and thereby provide high contrast.

The described invention takes advantage of the unique resolving power of X-rays to improve the contrast of an X-ray mask with electroplated absorber by plating up thicker absorber after the original mask patterning process is complete. This technique results in a higher resolution and better linewidth control masks than can be made by the prior art. The technique allows a low contrast mask or low energy electron beam to be used to make a high resolution X-ray mask.

Having thus described our invention what we claim as new and desire to secure as Letters Patent, is:

1. A method for fabricating a high resolution X-ray mask having high aspect ratio absorber patterns thereon comprising the steps of Step 1) on the top of an X-ray transparent membrane substrate, lithographically forming a pattern of X-ray absorbing material, said pattern of X-ray absorbing material having a first thickness and sidewalls substantially perpendicular to said top of said membrane;

Step 2) coating said patterned absorbing material and top membrane surfaces with a single layer of X-ray resist material;

Step 3) directing X-rays through the bottom of said membrane substrate to expose said single layer of X-ray resist material, said portions of said X-ray resist material disposed over said surfaces of said absorbing material on said membrane remaining unexposed;

Step 4) developing and etching said X-ray resist material to remove said unexposed portions disposed over said absorbing material;

Step 5) electroplating the surfaces of said absorbing material on said membrane substrate with an additional layer of absorbing material having a second thickness; and Step 6) removing said remaining X-ray resist material on said membrane substrate to leave said pattern of absorbing material on said membrane, said absorbing material having a resultant height consisting of said first thickness plus said second thickness of said additional absorbing material.

2. A method for fabricating a high resolution X-ray mask according to claim 1 wherein said transparent membrane substrate is capable of being permanently adherent to said X-ray absorbing material.

3. A method for fabricating a high resolution X-ray mask according to claim 1 wherein said X-ray absorbing material is a metal.

4. A method for fabricating a high resolution X-ray mask according to claim 1 wherein said X-ray absorbing material is gold.

5. A method for fabricating a high resolution X-ray mask according to claim 1 wherein first thickness of said absorbing material is in the order of 0.6 microns.

6. A method for fabricating a high resolution X-ray mask according to claim 5 wherein second thickness of said additional absorbing material is in the order of 0.2 microns and said resultant height is in the order of 0.8 microns.

* * * * *